US006594293B1

(12) United States Patent
Bulsara et al.

(10) Patent No.: US 6,594,293 B1
(45) Date of Patent: Jul. 15, 2003

(54) RELAXED INXGA1-XAS LAYERS INTEGRATED WITH SI

(75) Inventors: Mayank Bulsara, Cambridge, MA (US); Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 09/779,917

(22) Filed: Feb. 8, 2001

(51) Int. Cl.$^7$ .............................................. H01L 33/00
(52) U.S. Cl. ........................................ 372/43; 372/45
(58) Field of Search ........................ 372/43; 148/33.5

(56) References Cited

U.S. PATENT DOCUMENTS

| | | | | |
|---|---|---|---|---|
| 4,873,558 A | * | 10/1989 | Antreasyan et al. | 257/289 |
| 5,011,550 A | * | 4/1991 | Konushi et al. | 257/441 |
| 5,144,634 A | * | 9/1992 | Gasser et al. | 372/49 |
| 5,408,487 A | | 4/1995 | Uchida et al. | |
| 5,621,227 A | | 4/1997 | Joshi | 257/184 |
| 5,670,798 A | * | 9/1997 | Schetzina | 257/96 |
| 5,679,965 A | * | 10/1997 | Schetzina | 257/103 |
| 5,751,753 A | | 5/1998 | Uchida | |
| 5,859,864 A | * | 1/1999 | Jewell | 372/45 |
| 5,877,519 A | * | 3/1999 | Jewell | 257/190 |
| 6,039,803 A | * | 3/2000 | Fitzgerald et al. | 117/89 |
| 6,232,138 B1 | * | 5/2001 | Fitzgerald et al. | 257/18 |
| 6,291,321 B1 | * | 9/2001 | Fitzgerald | 438/494 |
| 6,399,966 B1 | * | 6/2002 | Tsuda et al. | 257/103 |
| 2001/0024884 A1 | * | 9/2001 | Fitzgerald | 438/494 |
| 2001/0047751 A1 | * | 12/2001 | Kim et al. | 117/94 |
| 2002/0030227 A1 | * | 3/2002 | Bulsara et al. | 257/346 |
| 2002/0090816 A1 | * | 7/2002 | Ashby et al. | 438/686 |

FOREIGN PATENT DOCUMENTS

| | | |
|---|---|---|
| EP | 0 375 564 | 6/1990 |
| EP | 0 514 018 A2 | 11/1992 |
| JP | 10284510 | 10/1998 |
| JP | 2001102312 | 4/2001 |
| WO | 99/28958 | 6/1999 |

OTHER PUBLICATIONS

Lee et al., "Reduction of Defects in Highly Lattice Mismatched InGaAs Grown on GaAs by MOCVD," Mat. Res. Soc. Symp., vol. 355, (1995) pp. 649–654.

Goldman et al., "Correlation of Buffer Strain Relaxation Modes with Transport Properties of Two Dimensional Electron Gases," J. Appl. Phys., vol. 80 No. 12, (Dec. 15, 1996) pp. 6849–6854.

Chyi et al., "Material Properties of Compositionally Grades InGaAs and InAlAs Epilayers Grown on GaAs Substrates," J. Appl. Phys., vol. 79 No. 11, (Jun. 1, 1996) pp. 8367–8370.

Lee et al., "Optical Properties of InGaAs Linear Graded Buffer Layers on GaAs Grown by Metalorganic Chemical Vapor Deposition," Appl. Phys. Lett., (May 20, 1996).

(List continued on next page.)

*Primary Examiner*—Paul Ip
*Assistant Examiner*—Dung Nguyen
(74) *Attorney, Agent, or Firm*—Testa,Hurwitz&Thibeault, LLP

(57) ABSTRACT

A method of processing semiconductor materials and a corresponding semiconductor structure, including providing a virtual substrate of a GaAs epitaxial film on a Si substrate, and epitaxailly growing a relaxed graded layer of $In_xGa_{1-x}As$ at a temperature ranging upwards from about 600° C. with a subsequent process for planarization of the InGaAs alloy.

36 Claims, 9 Drawing Sheets

OTHER PUBLICATIONS

Valtuena et al., "Influence of the Surface Morphology on the Relaxation of Low–Strained $In_xGa_{1-x}As$ Linear Buffer Structures" Journal of Crystal Growth (1997) pp. 281–291.

Bulsara et al., "Relaxed $In_xGa_{1-x}As$ Graded Buffers Grown With Organometallic Vapor Phase Epitaxy on GaAs" American Institute of Physics (1998) vol. 72 No. 13 pp. 1608–1610.

Knall et al., "The Use of Graded InGaAs Layers and Patterned Substrates To Remove Threading Dislocations From GaAs on Si" J. Appl. Phys. Sep. 1, 1994, pp. 2697–2702.

Joshi et al., "Monolithic InGaAs–on–silicon Short Wave Infrared Detector Arrays" SPIE vol. 2999, pp. 211–224.

Steve M. Ting, "Monolithic Integration of III–V Semiconductor Materials and Devices on Silicon" Department of Materials Science and Engineering (Apr. 30, 1999) pp. 3–152.

Mayank T. Bulsara, "Materials Issues With the Integration of Lattice–Mismatched $In_xGa_{1-x}As$ Devices on GaAs", Massachusetts Institute of Technology (1993) pp. 1–178.

Uchida et al., "A 1.3 $\mu$m Strained Quantum Well Laser on a Graded InGaAs Buffer With a GaAs Substrate", Journal of Electronic Materials, vol. 25, No. 4, 1996, pp. 581–584.

U.S. patent application Ser. No. 09/198,960, Fitzgerald et al., filed Nov. 24, 1998.

U.S. patent application Ser. No. 09/764,182, Fitzgerald, filed Jan. 17, 2001.

U.S. patent application Ser. No. 09/764,177, Fitzgerald, filed Jan. 17, 2001.

"CW Operation of a 1.3–$\mu$m Strained Quantum Well Laser on a Graded InGaAs Buffer with a GaAs Substrate"; by Uchida et al.; Fujitsu Laboratories Ltd.; Japan; Publication date May 9, 1995; pp. 22–25.

Krishniamoorthy et al., "Application of Critical Compositional Difference: Concept to the Growth of Low Dislocation Density InGaAs on GaAs," J. Appl. Phys., vol. 72 No. 5, (Sep. 1, 1992) pp. 1752–1757.

Chang et al., "Strain Relaxation of Compositionally Graded InGaAs Buffer Layers for Modulation Doped InGaAs Heterostructures," Appl. Phys. Lett., vol. 60 No. 9, (Mar. 2, 1992): pp. 1129–1131.

Lord et al., "Graded Buffer Layers for Molecular Beam Epitaxial Growth of High In Content InGaAs on GaAs for Optoelectronics," Mat. Res. Soc. Symp. Proc., vol. 281, (1993) pp. 221–225.

Molina et al., "Strain Relief in Linearly Composition Buffer Layers: A Design Scheme to Grow Dislocation–Free and Unstrained Epilayers," Appl. Phys. Lett., vol. 65 No. 19, (Nov. 7, 1994) pp. 2460–2462.

Goorsky et al., "Structural Properties of Highly Mismatched InGaAs–based devices grown by Molecular Beam Epitaxy on GaAs Substrates," J. Vac. Sci. Technol., (Mar./Apr. 1994) pp. 1034–1037.

Molina et al., "Dislocation Distribution in Graded Composition InGaAs Layers," Mat. Res. Soc. Symp. Proc., vol. 325, (1994) pp. 223–228.

Ferrari et al., "Mechanisms of Strain Release in Molecular Beam Epitaxy Grown InGaAs/GaAs Buffer Heterostructures," Materials Science and Engineering, (1994) pp. 510–514.

Sigle et al. "Strain Relaxation in Graded InGaAs and InP Buffer Layers on GaAs (001)," Scanning Microscopy, vol. 8 No. 4. (1994) pp. 897–904.

Goldman et al., "Strain Relaxation in Compositionally Graded InGaAs/GaAs Heterostructures," Scanning Microscopy, vol. 8 No. 1, (1994) pp. 905–912.

Eldredge et al., "Effect of Substrate Miscut on the Structural Properties of InGaAs Linear Graded Buffer Layers Grown by Molecular–Beam Epitaxy on GaAs," J. Vac. Sci. Technol., vol. 13 No. 2, (Mar./Apr. 1995) pp. 689–691.

Rammohan et al., "Study of $\mu$m–scale Spatial Variations in Strain of a Compositionally Step–Graded InGaAs/GaAs (001) Heterostructure," Appl. Phys. Lett., vol. 66 No. 7, (Feb. 13, 1995) pp. 869–871.

Goldman et al., "Effects of Substrate Misorientation Direction on Strain Relaxation at InGaAs/GaAs (001) Interfaces," Mat. Res. Soc. Symp. Proc., vol. 379, (1995) pp. 21–26.

International Search Report for International Patent Application No. PCT/US02/02334, dated Nov. 26, 2002, 7 pages.

* cited by examiner

| GROWTH TEMP (°C) | % INDIUM IN GRADED BUFFER | GRADING RATE (%In/μm) | RESIDUAL $\varepsilon$ ($\times 10^{-3}$) | % OF EQUILIBRIUM $\varepsilon$ RELIEVED | 2θ FWHM FOR $In_xGa_{1-x}As$ CAP LAYER | ω FWHM FOR $In_xGa_{1-x}As$ CAP LAYER |
|---|---|---|---|---|---|---|
| 500 | 9.81 | 15.32 | -2.15 | 79 | 233 | 505 |
| 550 | 8.21 | 11.90 | -1.59 | 85 | 283 | 356 |
| 600 | 6.06 | 8.81 | -1.41 | 84 | 151 | 512 |
| 650 | 7.76 | 8.21 | -1.28 | 89 | 144 | 415 |
| 700 | 7.14 | 7.51 | -1.59 | 79 | 109 | 460 |

FIG. 4

Surface of III-V Compound Compositionally Graded Layer After Epitaxy

Surface of III-V Compound Compositionally Graded Layer After Epitaxy and Planarization

RELAXED INXGA1-XAS LAYERS INTEGRATED WITH SI

BACKGROUND OF THE INVENTION

The invention relates to the field of lattice-mismatched epitaxy, and in particular to the field of creating lattice-mismatched devices based on relaxed InGaAs alloys on Si substrates.

Most electronic and optoelectronic devices that require layers deposited by epitaxial growth utilize lattice-matched epitaxial layers, i.e. the crystal structure of the layer has the same lattice constant as that of the substrate. This lattice-matching criterion has been important in creating high quality materials and devices, since lattice-mismatch will create stress and in turn introduce dislocations and other defects into the layers. The dislocations and other defects will often degrade device performance, and more importantly, reduce the reliability of the device.

The applications of lattice-mismatched layers are numerous. In the InGaAs material system, one important composition is in the range of 20–60% In. These compositions allows the fabrication of 1.3 and 1.55 μm optical devices as well as high electron mobility transistors with superior performance on GaAs-based epitaxial layers integrated on Si substrates. Alloys in the desired composition range are lattice-mismatched to GaAs, and thus usually suffer from high dislocation densities. One known method to minimize the number of dislocations reaching the surface of a relaxed, mismatched layer is to compositionally grade the material (in this case through grading the In composition) so that the lattice-mismatch is extended over a great thickness. In addition to the requirement that such layers be low in defect density, the final surface must be smooth with respect to standard optical lithography techniques and the total layer structure InGaAs epitaxial films/GaAs epitaxial films/Si substrate must be able to accommodate thermal expansion mismatch.

Compositional grading is typically accomplished in InGaAs alloys by grading the In composition at a low growth temperature, typically less than 500° C. The dominant technique for depositing relaxed InGaAs layers is molecular beam epitaxy (MBE). MBE has a limited growth rate; therefore, the growth of these relaxed buffers is tedious and costly. In addition, the initial substrate is typically bulk GaAs, not a GaAs epitaxial film of high material quality on Si, and the surface of the InGaAs film is generally not smooth enough for high density optical lithography. A supply of virtual InGaAs substrates (a Si substrate with a high quality, relaxed InGaAs layer at the surface) with a low surface roughness would be in demand commercially. The user could buy the substrate and deposit the device layers without having to deposit the graded InGaAs layer and without introducing the crosshatched surface, which is a signature of compositionally graded films. To create a supply of these wafers at low cost, metalorganic chemical vapor deposition (MOCVD) offers greater potential. In conjunction with MOCVD, a planarization step after the epitaxial process enables InGaAs-on-Si virtual substrates of unprecedented quality.

There have been no successful reports of high quality relaxed graded InGaAs layers grown by MOCVD on GaAs-based epitaxial films on Si substrates. There are fundamental materials problems with InGaAs graded layers grown in a certain temperature window and the provision of a high quality GaAs film on Si has its own inherent challenges.

SUMMARY OF THE INVENTION

It is an object of the invention that with the appropriate grading rate, there is an unforeseen high temperature window, which can be accessed with MOCVD and not MBE, in which high quality relaxed InGaAs alloys can be grown on a GaAs-based epitaxial film on a Si substrate. Relaxed InGaAs grown with MOCVD in this temperature range has the economic advantages of the MOCVD technique, as well as the low defect densities and relaxation associated with high temperature growth. A subsequent planarization step makes the virtual InGaAs-on-Si substrates more suitable for high volume manufacturing.

Another object of the invention is to allow the fabrication of relaxed high quality InGaAs alloys on a Si substrate with the MOCVD technique. These virtual InGaAs substrates can be used in a variety of applications, in particular 1.3 and 1.55 μm optical devices and high-speed microwave transistors. It is a further object of the invention to provide the appropriate conditions during growth in which it is possible to achieve high quality material and devices using this InGaAs/GaAs.

$In_xGa_{1-x}As$ structures with compositionally graded buffers grown with MOCVD on GaAs substrates and characterized with plan-view and cross-sectional transmission electron microscopy (PV-TEM and X-TEM), atomic force microscopy (AFM), and x-ray diffraction (XRD) show that surface roughness experiences a maximum at growth temperatures near 550° C. The strain fields from misfit dislocations induce a deleterious defect structure in the <110> directions. At growth temperatures above and below this temperature, the surface roughness is decreased significantly; however, only growth temperatures above this regime ensure graded buffer relaxation, uniform composition caps, and high quality material. Using an optimum growth temperature of 700° C. for $In_xGa_{1-x}As$ grading, it is possible to produce $In_{0.33}Ga_{0.67}As$ diodes on GaAs with threading dislocation densities $<8.5 \times 10^6/cm^2$. Although previous experiments have not been carried out on GaAs films on Si substrates, the techniques can be transferred with modifications to address thermal mismatch constraints.

Accordingly, the invention provides a method of processing semiconductor materials, including providing a virtual substrate of a GaAs epitaxial film on a Si substrate; and epitaxially growing a relaxed graded layer of $In_xGa_{1-x}As$ at a temperature ranging upwards from about 600° C. with a subsequent process for planarization of the InGaAs alloy.

The invention also provides a semiconductor structure including a substrate of a GaAs epitaxial film on a Si, and a relaxed graded layer of $In_xGa_{1-x}As$ that is epitaxially grown at a temperature ranging upwards from about 600° C.

These and other objects, features and advantages of the present invention will become apparent in light of the following detailed description of preferred embodiments thereof, as illustrated in the accompanying drawings.

BRIEF DESCRIPTION OF THE DRAWINGS

FIG. 4 is a table which shows the growth temperature, composition, and grading rate form nominal $x_{In}$=0.06 structures;

DETAILED DESCRIPTION OF THE INVENTION

Figure 1A:
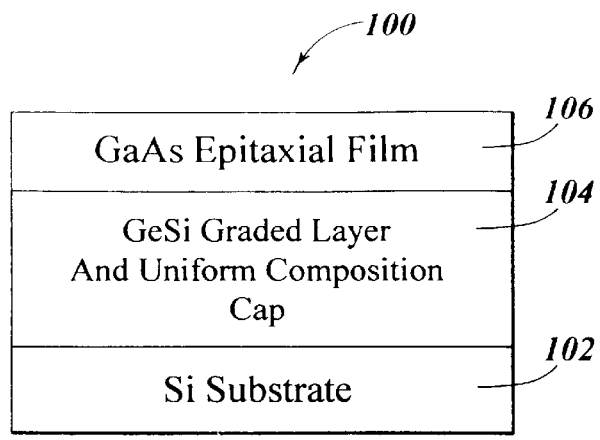
FIGS. 1A and 1B are schematic process flows of two methods of producing epixtaxial GaAs-on-Si virtual substrates.

In order to produce a high quality InGaAs epitaxial film on Si, one must first produce a GaAs on Si virtual substrate. FIG. 1A shows an exemplary embodiment of a virtual substrate structure 100. The structure is produced by grading SiGe from 0 to 100% Ge and depositing a uniform cap of Ge (104) on a Si substrate 102, and thereafter depositing an epitaxial layer 106 of GaAs. Since GaAs is lattice matched to Ge, the grading procedure results in a low defect density, GaAs film. This virtual substrate growth is actually a multi-step process that involves epitaxy, planarization, and careful preparation of the Ge surface prior to the GaAs epitaxy. These processes are described in detail in Currie et al., Appl. Phys. Lett., 72, 1718 (1998) and Ting et al., J. Elec. Mater., 27, 451 (1998), both of which are incorporated herein by reference.

Figure 1B:
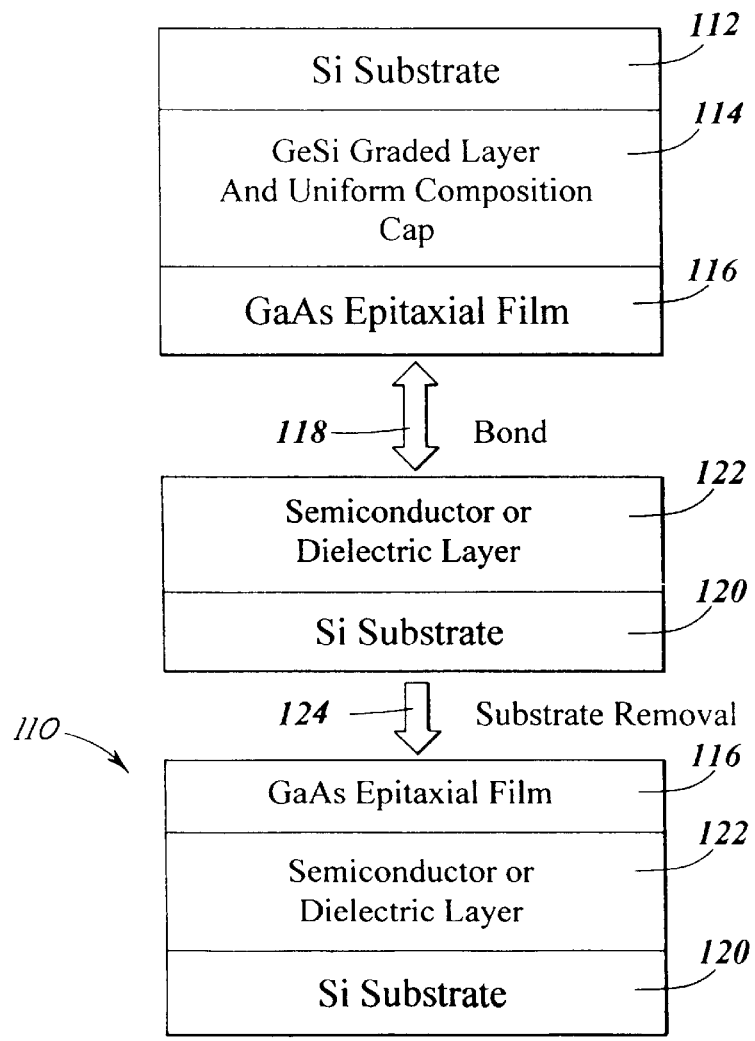

FIG. 1B is another exemplary embodiment of a GaAs virtual substrate structure 110. This structure is produced by grading SiGe to uniform 100% Ge 114 on a Si substrate 112, and thereafter depositing an epitaxial layer 116 of GaAs, as previously described. After the GaAs/SiGe/Si substrate is produced, it is bonded (118) to a second Si substrate 120 having a semiconductor or dielectric layer 122. The first Si substrate and the SiGe graded layers are subsequently removed (124) to provide a high quality GaAs layer directly on Si, thus the resulting structure 110. Since Ge has a thermal expansion coefficient similar to III–V materials, the removal of the SiGe buffer eliminates a thermally mismatched layer and thus allows for the growth of thicker InGaAs layers on the GaAs virtual substrate. In addition, the second silicon substrate can have a surface layer dielectric, enabling the production of GaAs/Insulator/Si substrates. The introduction of dielectric layers can be useful as a diffusion barrier between the InGaAs and Si during subsequent device processing.

Compositionally graded buffers are implemented in lattice mismatched heteroepitaxy to maintain a low threading dislocation density and to achieve a completely relaxed growth template. MOCVD is a well-established growth technique that is capable of growth rates significantly greater than that of MBE. Therefore, MOCVD is a more practical growth tool for fabricating graded buffers. The ability to grow $In_xGa_{1-x}As$ graded buffers with MOCVD facilitates the manufacture of commercial lattice-mismatched devices, including 1.3 μm wavelength emitting lasers on GaAs substrates or virtual GaAs substrates on Si.

Figure 2:
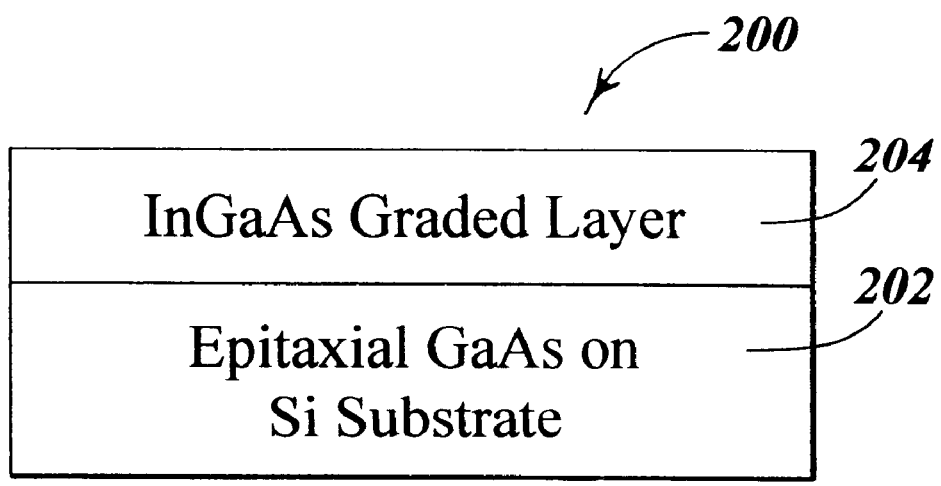
FIG. 2 is a simplified block diagram of a semiconductor structure in accordance with the invention.

In accordance with the invention, $In_xGa_{1-x}As$ graded buffers are grown on GaAs substrates with MOCVD at different growth temperatures. FIG. 2 is a simplistic block diagram of a semiconductor structure 200 including a substrate 202 of epitaxial GaAs on Si, on which is grown a relaxed graded layer 204 of $In_xGa_{1-x}As$. Exemplary samples were grown in a Thomas Swan atmospheric research reactor on bulk n+ GaAs substrates. The buffers were characterized with planview and cross-sectional transmission electron microscopy (PV-TEM and X-TEM), atomic force microscopy (AFM), and x-ray diffraction (XRD). The PV-TEM and X-TEM characterization were done with a JEOL 2000FX microscope. The XRD was performed with a Bede $D^3$ triple axis diffractometer. The AFM experiments were conducted with a Digital Instruments D3000 Nanoscope.

In order to explore graded $In_xGa_{1-x}As$ relaxation, exemplary samples were graded to $x_{In}$≈0.06 (≈0.4% mismatch). Such a small amount of mismatch produces excellent relaxed layers independent of most growth parameters.

Undoped $In_xGa_{1-x}As$ graded buffers with nominal final indium concentration of $x_{In}$=0.06 were grown at temperatures between 500–700° C. In addition, $x_{In}$=0.15 and $x_{In}$=0.33 graded buffers were grown at 700° C. All growths were performed with a 5000 sccm $H_2$ carrier flow and 134 sccm $AsH_3$ flow. The trimethylgallium (TMG) flow was fixed at 0.030 sccm throughout the graded buffer growth sequence. Composition grading was accomplished by stepping the trimethylindium (TMI) flow rate by approximately 0.005 sccm up to a final flow rate. This final rate was 0.031 sccm for the $x_{In}$=0.06 graded buffer, 0.077 sccm for the $x_{In}$=0.15 graded buffer, and 0.163 sccm for the $x_{In}$=0.33 graded buffer. Sufficient vent times at the growth temperature were incorporated after each change in TMI flow setting to ensure the growth of the expected composition. All samples, except the structure with the $x_{In}$=0.33 graded buffer, had an undoped 1 μm uniform cap layer 106. The sample with a $x_{In}$=0.33 graded buffer had a 2 μm cap which incorporated a Zn and Si doped PIN diode structure. For the $x_{In}$=0.33, the compositionally graded layer was also doped n-type with Si.

Figure 3:
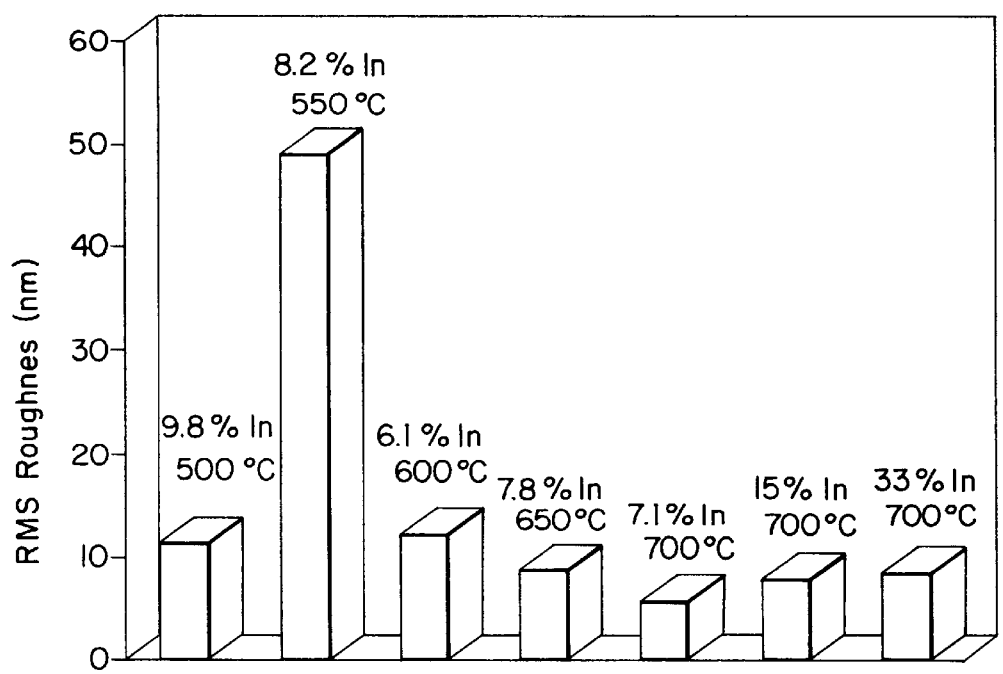
FIG. 3 is a graph illustrating RMS roughness for structures grown at different temperatures.

A visual inspection of the surface morphology reveals a strong dependence on growth temperature, a surprising result for such a low lattice mismatch. AFM surface topology data taken on 10 μm×10 μm areas of each sample, including the $x_{In}$=0.15 and $x_{In}$=0.33 structures is depicted in the graph of FIG. 3. The data shows that the rms roughness for the nominal $x_{In}$=0.06 sample grown at 550° C. has a significantly greater rms roughness value (52 nm) than the other structures with an rms value of about 10 nm. In fact, despite the low mismatch, the sample grown at 550° C. is not specular to the eye, i.e., it is visibly rough. In addition, the surface roughness of the equivalent $x_{In}$=0.33 structure grown at 700° C. was less than the surface roughness of $x_{In}$=0.06 structures grown at lower temperatures.

A criterion for applications is that there must be a great amount of strain relief in conjunction with a low threading dislocation density. To determine the degree of strain relaxation and the indium composition, glancing exit (224) reciprocal space maps were conducted with triple axis XRD. Since the $x_{In}$=0.06 structures were of low mismatch and relatively thin (2 μm), the effect of epilayer tilt was expected to be negligible, and thus no glancing incidence (224) or (004) reciprocal space maps were acquired to extract this effect.

X-TEM was used to measure the thickness and, in combination with the final composition, the grading rate. FIG. 4 is a table which shows the growth temperature, composition, and grading rate for the nominal $x_{In}$=0.06 structures. The table shows that the indium composition steadily increased with decreasing temperature (with the exception of the structure grown at 600° C.), which is due to the lower cracking temperature for TMI. In addition, the growth rate decreased with decreasing temperature, which in turn provided for a higher grading rate at lower temperature. It should be noted that there is a small error (≈300 Å) in the measurement of the graded buffer thickness due to the calibration of the TEM and the tilting of the TEM specimens.

FIG. 4 shows the residual strain in each of the nominal $x_{In}$=0.06 structures as a function of temperature. The structure grown at 500° C. had a noticeably greater residual strain in the structure, and there is no general trend among the other samples. However, since the compositions and grading rates differed, the efficiency of the graded buffers at relieving strain was compared by calculating the equilibrium plastic strain rate (Strain/thickness) and the overall equilibrium plastic strain.

The equilibrium plastic rate is given by $$C_\delta(h) = C_f + \frac{3D\left(1 - \frac{v}{4}\right)\ln\left(\frac{2\pi bC_\delta}{e}\right)}{2Yh^2} \quad (1)$$

where $C_f$ is the mismatch introduction rate (misfit/thickness), Y is the Young's modulus, and h is the film height. D is given by D=Gb/[2(1-v)] where G is the shear modulus, v is Poisson's ratio, and b is the magnitude of the Bergers vector (60° dislocations are assumed). The expression for the overall plastic deformation in a graded buffer is:

$$\delta_{eq}(h) = C_\delta(h)h \quad (2)$$

The percentage of the equilibrium strain relieved (percent relaxation ) is also listed in the table of FIG. 4. All the samples showed a similar degree of relaxation (≈80–85%). At such a low mismatch, it is difficult to distinguish the most effective growth conditions for strain relief. The disparities in strain relief were expected to be more pronounced at higher indium compositions. In general, higher growth temperatures allow for more efficient strain relief.

Figure 5:
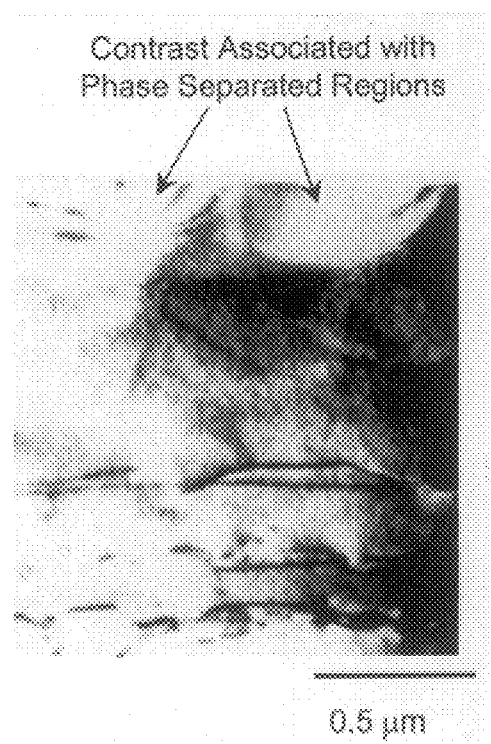
FIG. 5 is a X-TEM micrograph for a $x_{In}$=0.06 $In_xGa_{1-x}As$ structure grown at 550° C.
Figure 6:
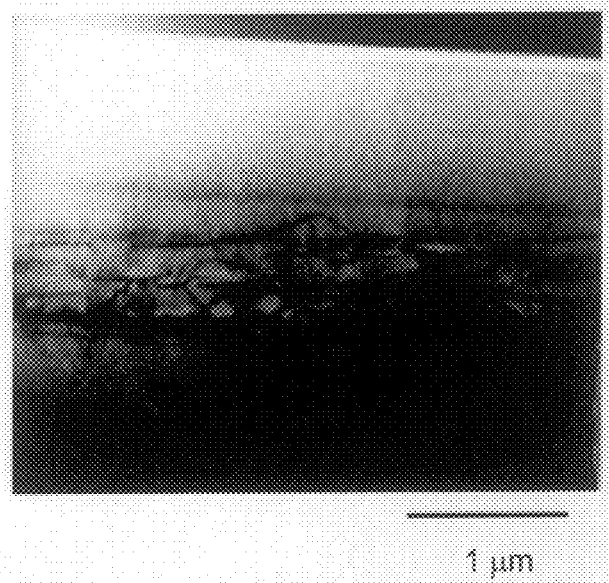
FIG. 6 is a X-TEM micrograph for a $x_{In}$=0.06 $In_xGa_{1-x}As$ structure grown at 700° C.

The X-TEM and XRD data exhibit differences in microstructure between the $x_{In}$=0.06 sample grown at 550° C. and the same structure grown at 700° C., which is in agreement with the drastic difference in surface morphology. FIGS. 5 and 6 show the X-TEM micrographs of these two structures. Both structures have threading dislocation densities below the X-TEM limit (<10$^8$/cm$^2$). Thus, the very poor structure morphology of the 550° C. sample is not due to a very high defect density in the top $In_xGA_{1-x}As$ layer. The uniform cap layer of the structure grown at 550° C. does show additional semi-circular regions in the top of the film. These features are not dislocations, as the contrast is weak, but rather can be attributed to variations in strain from neighboring regions that may have undergone phase separation during growth. However, recent studies show that high-energy defects are formed in this temperature range, and they may be responsible for the strain contrast although their origin is uncertain. Regardless, growth temperatures in this range near 550° C. lead to rough surface morphology which later leads to high threading dislocation densities.

A (224) glancing exit reciprocal space map of this structure shows a significantly greater spread in the 2θ direction for the uniform cap than any of the other samples grown at different temperatures. The FWHM data for the XRD peaks from the uniform caps are listed in the table of FIG. 4. It will be appreciated that the sharpest peak in the 2θ direction is from the sample grown at 700° C. The spread in the 2θ direction for the 550° C. sample is consistent with a spread in lattice constant due to indium composition variations or defect formations. In addition, the spread in the ω direction (FWHM data also tabulated in the table of FIG. 4) for the cap in the structure grown at 550° C. was less than that of the other $x_{In}$=0.06 samples, creating a circular projection of the (224) spot in reciprocal space, as opposed to the typical elliptical spot expected from a high quality relaxed heterostructure.

Figure 7:
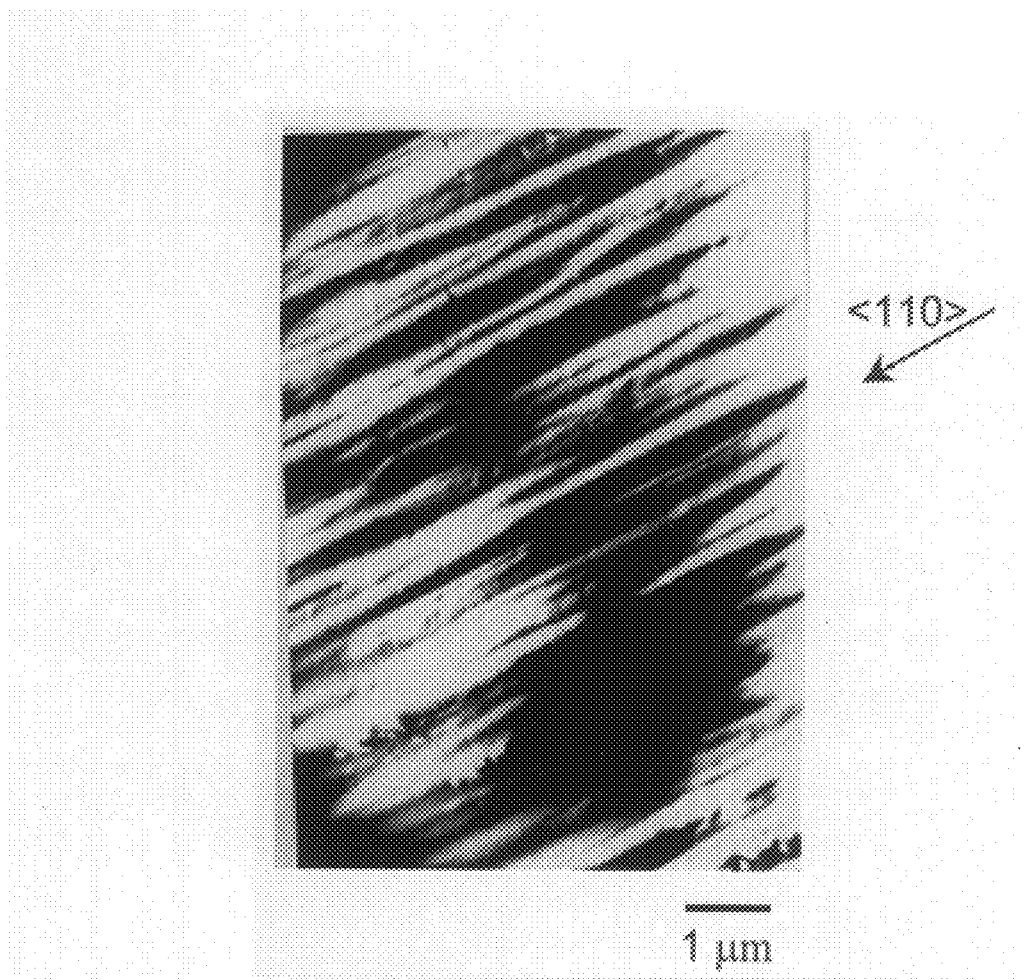
FIG. 7 is a PV-TEM micrograph of a $x_{In}$=0.06 structure grown at 550° C. (g=<220>)

FIG. 7 shows a plan view TEM image of the $x_{In}$=0.06 $In_xGa_{1-x}As$ structure grown at 550° C. showing striations under a g=<220> diffraction condition in <110> directions (the same direction as the dislocations in the graded buffer), which may be attributed to compositional variations due to phase separation and/or defect formation at the boundaries between regions. These striations disappear under the other g=<220> condition and g=<400> conditions.

The data suggests that there is a correlation between the dislocations in the graded buffer and the observed boundary defects, which in turn causes the drastic surface roughening in the temperature regime where phase separation is favored. In the low temperature growth regime (500° C.), the surface roughening is kinetically limited, as the atoms do not have the mobility to attach to sites that cause the long-range variations seen at higher growth temperatures. In the high temperature growth regime (<600° C.), thermodynamics dictate the growth conditions, as the growth occurs above the point at which such boundary defects are favorable.

At the growth temperatures within the range 500–600° C., strained regions with boundaries form, as shown in FIG. 7. These features occur along the <110> direction since the misfit dislocations, strain fields, and cross-hatch surface lie along the <110> directions. As a consequence, the $In_xGa_{1-x}As$ layers roughen as surface energy is created and as strain energy is relieved. It will be appreciated that this roughening, i.e., very pronounced cross-hatch pattern, is much more severe than the roughening that occurs in systems that lack this apparent phase instability.

Although the X-TEM image of the $x_{In}$=0.06 structure grown at 550° C. did not show threading dislocations, it has been shown in the $Si_xGe_{1-x}$ materials system that a rough surface with increasing lattice mismatch will eventually lead to a high threading dislocation density. This phenomenon even occurs in structures with slow grading rates and is described in detail in Samavedam et al., "Novel Dislocation Structure and Surface Morphology Effects in Relaxed Ge/SiGe/Si Structures", J. Appl. Phys. 81(7), 3108 (1997), incorporated herein by reference. Grading to greater indium compositions at 550° C. produces very rough surfaces that eventually lead to high threading dislocation densities. Although surface roughness can be decreased by growing at lower temperature, this low surface roughness cannot be achieved without compromising the relaxation of the graded buffer. This dependency implies that the only window for growth of $In_xGa_{1-x}As$ graded buffers that are relaxed and have good surface morphology is at high temperature. It is important to note that MBE can not attain such high growth temperatures due to limited arsenic overpressure.

Figure 8:
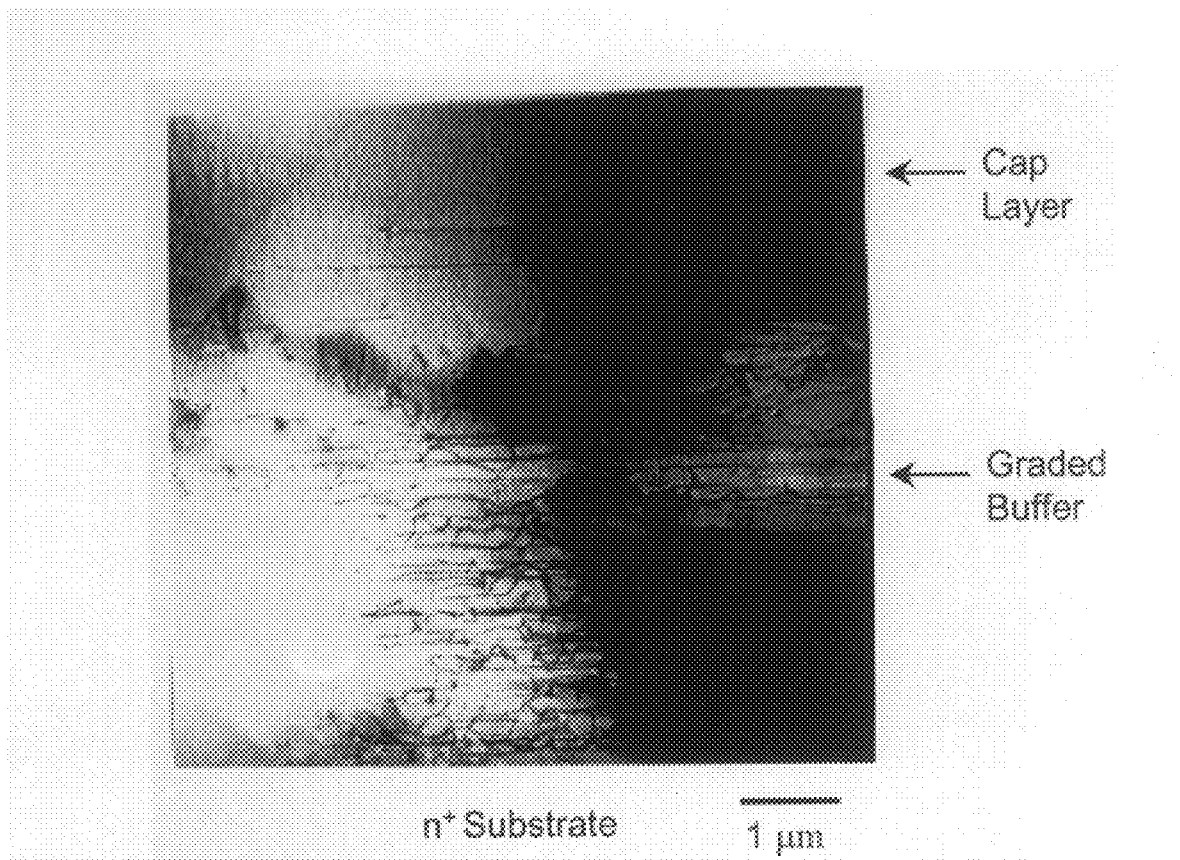
FIG. 8 is an X-TEM micrograph of a $x_{In}$=0.33 $In_xGa_{1-x}As$ structure grown at 700° C.

With surface roughness and relaxation conditions determined to be optimum at a growth temperature of 700° C., a $x_{In}$=0.33 device structure was grown. FIG. 8 is an X-TEM micrograph of this structure. No threading dislocations could be observed in PV-TEM, showing that the threading dislocation density in this structure is <8.5×10$^6$/cm$^2$ given this size of viewable area in TEM. Glancing incidence (224) and glancing exit θ/2θ double axis XRD scans show the composition to be $x_{In}$=0.33 and the structure to be 99.39% relaxed.

Accordingly, it has been demonstrated that growth of $In_xGa_{1-x}As$ graded buffers is sensitive to the growth temperature. In the temperature range approximately between 500 and 600° C., the surface morphology of the structures degrades and rapidly leads to poor quality layers, even at relatively low mismatch. Only growth at higher temperatures produces relaxed layers with sufficient relaxation, good surface morphology, and low threading dislocation densities. The low threading dislocation densities are sufficient for the fabrication of electronic and optoelectronic devices such as 1.3 µm wavelength emitting lasers.

Figure 9:
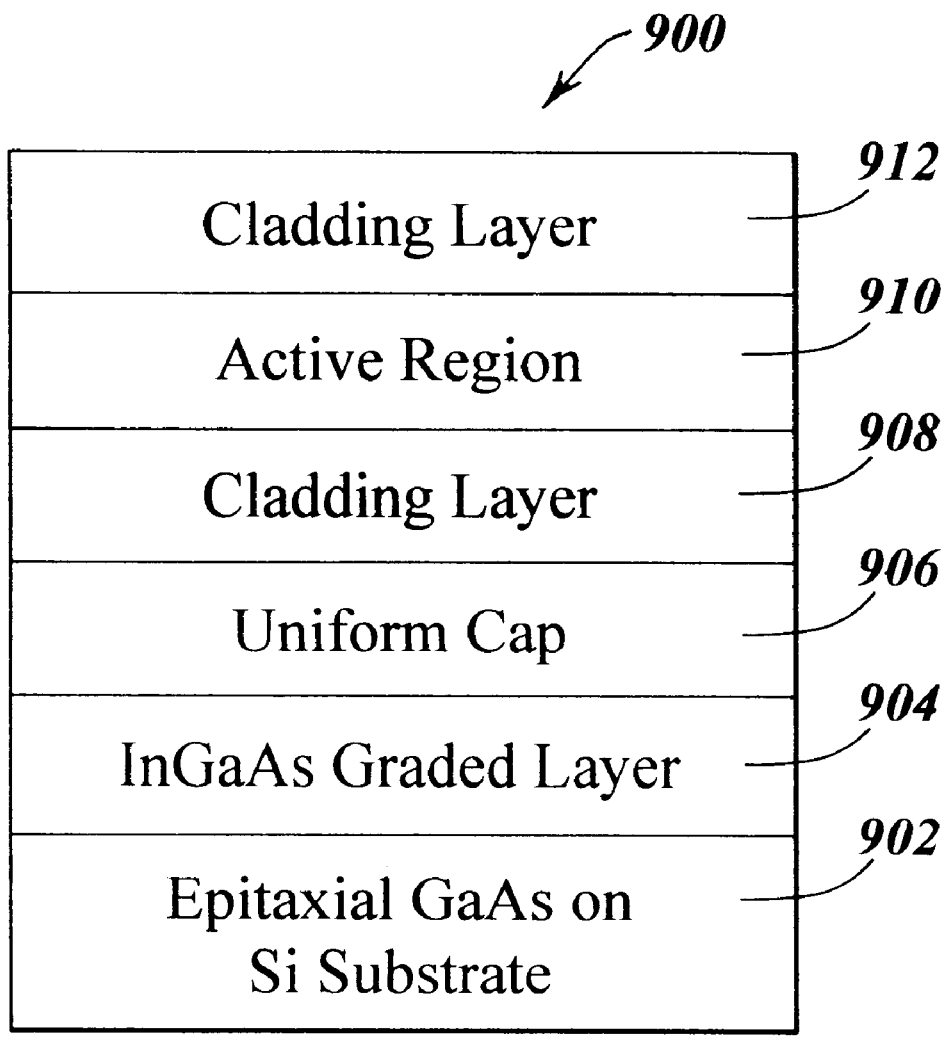
FIG. 9 is a simplified block diagram of a semiconductor structure of the invention with a device configured thereon.

FIG. 9 is a simplified block diagram of a semiconductor structure 900 of the invention with a device configuration thereon. As shown in FIG. 9, once a virtual substrate 902 of $In_xGa_{1-x}As$ is created, new optoelectronic and electronic devices can be configured on top of the structure. For example, analogous to heterostructures grown on GaAs substrate, heterostructure devices composed of other alloy compositions can now be fabricated on these substrates. Initially, an InGaAs graded layer 904 and uniform cap layer 906 can be provided on the substrate 902. Layers 908, 910, 912 provided thereafter can be layers of the $Al_y(In_xGa_{1-x})_{1-y}As$ alloy family. These alloys can be used to create 1.3 µm heterostructure layers on expitaxial GaAs-on-Si substrates, a great advantage over the 1.3 µm devices that need to be grown on InP substrates due to the lattice-matching criterion. In the illustrated embodiment, layers 908 and 912 are the cladding layers of a heterostructure laser, and layer 910 is the active region.

Similarly heterostructures from the $Al_y(In_xGa_{1-x})_{1-y}As$ alloy system on these $In_xGa_{1-x}As$ buffer layers can be fabricated into high transconductance field effect transistors (FETs) useful in microwave applications. The virtual substrate (InGaAs-on-Si substrate) allows the electron channel or active region (layer 910 in FIG. 9) to be composed of much higher In concentrates than FETs grown on GaAs without the virtual buffer. The higher In concentration in the channel results in very high electron mobilities, and the large band off-sets that can be created in the $Al_y(In_xGa_{1-x})_{1-y}As$ heterostructure system (910–912) create a very high electron concentration in the channel. Thus, the high mobility and high electron concentrations lead to transistors with very high transconductance.

Figures 10A, 10B:
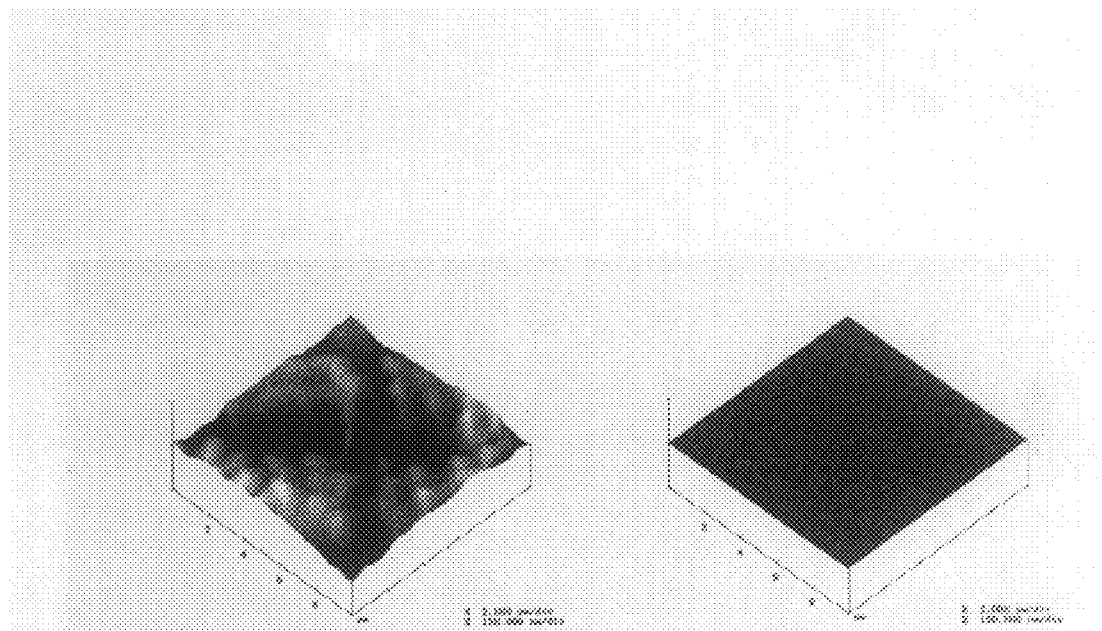
FIGS. 10A and 10B are surface scanned images of III–V compound epitaxial graded layers before and after a planarization step.

Although InGaAs alloys of low defect density can be fabricated via epitaxial alloys alone, even greater quality buffers can be created through combination with other improvements for graded layers, such as the use of planarization techniques to lower defect densities in graded buffers or the finishing of the surface after epitaxy to allow for a superior surface for optical lithography. FIGS. 10A and 10B show AFM images of InGaP graded layers on GaP substrate after epitaxy and after epitaxy and a planarization step, respectively. The rms roughness after the planarization step is far improved from the original surface after epitaxy.

Although the present invention has been shown and described with respect to several preferred embodiments thereof, various changes, omissions and additions to the form and detail thereof, may be made therein, without departing from the spirit and scope of the invention.

What is claimed is:

1. A semiconductor structure, comprising:
   a Si substrate;
   a GaAs epitaxial film on said Si substrate, said epitaxial film having a threading dislocation density of less than $10^7$ cm$^{-2}$; and
   a graded layer of $In_xGa_{1-x}As$ epitaxially grown on said epitaxial film ranging upwards from about 600° C. with a final uniform composition layer of $In_yGa_{1-y}As$.

2. The structure of claim 1, wherein said $In_yGa_{1-y}As$ epitaxial layer is planarized.

3. The structure of claim 1, wherein said uniform composition layer of $In_yGa_{1-y}As$ includes an induim fraction of at least 20%.

4. The structure of claim 1, wherein said uniform composition layer of $In_yGa_{1-y}As$ is at least 500 nm.

5. The structure of claim 1, wherein said uniform composition layer of $In_yGa_{1-y}As$ has a threading dislocation density less than $10^7$ cm$^{-2}$.

6. The structure of claim 1, wherein said GaAs epitaxial film on Si is at least 90% relaxed.

7. The structure of claim 1, wherein said graded layer is graded in indium content at a gradient of less than 15% indium per micrometer.

8. The structure of claim 1, wherein said graded layer and said uniform composition layer are grown via organometallic vapor phase epitaxy.

9. The structure of claim 1 further comprising an epitaxially grown compositionally graded layer of $Ge_zSi_{1-z}$ between said GaAs epitaxial film and said Si substrate.

10. The structure of claim 1 further comprising an epitaxially grown compositionally graded layer with at least one planarization step during processing between said GaAs epitaxial film and said Si substrate.

11. The structure of claim 1 further comprising providing an insulator between said GaAs epitaxial film and said Si substrate.

12. The structure of claim 1 further comprising a diffusion barrier between said GaAs epitaxial film and said Si substrate.

13. The structure of claim 2 further comprising a III–V compound laser structure epitaxially grown on said planarized $In_yGa_{1-y}As$ epitaxial film.

14. The structure of claim 13, wherein said structure comprises an integrated circuit.

15. The structure of claim 2, wherein a III–V compound laser structure is wafer bonded to said planarized $in_yGa_{1-y}As$ epitaxial film.

16. The structure of claim 15, wherein said structure comprises an integrated circuit.

17. The structure of claim 2 further comprising a III–V compound field effect transistor structure epitaxially grown on said planarized $In_yGa_{1-y}As$ epitaxial film.

18. The structure of claim 17, wherein said structure comprises an integrated circuit.

19. The structure of claim 2, wherein a III–V compound field effect transistor structure is wafer bonded to said planarized $In_yGa_{1-y}As$ epitaxial film.

20. The structure of claim 19, wherein said structure comprises an integrated circuit.

21. An integrated circuit comprising:
    a semiconductor structure, comprising:
      a Si substrate;
      a GaAs epitaxial film on said Si substrate, said epitaxial film having a threading dislocation density of less than $10^7$ cm$^{-2}$; and
      a graded layer of $In_xGa_{1-x}As$ epitaxially grown on said epitaxial film ranging upwards from about 600° C. with a final uniform composition layer of $In_yGa_{1-y}As$.

22. The circuit of claim 21, wherein said $In_yGa_{1-y}As$ epitaxial layer is planarized.

23. The circuit of claim 21, wherein said uniform composition layer of $In_yGa_{1-y}As$ includes an indium fraction of at least 20%.

24. The circuit of claim 21, wherein said uniform composition layer of $In_yGa_{1-y}As$ is at least 500 nm.

25. The circuit of claim 21, wherein said uniform composition layer of $In_yGa_{1-y}As$ has a threading dislocation density less than $10^7$ cm$^{-2}$.

26. The circuit of claim 21, wherein said GaAs epitaxial film on Si is at least 90% relaxed.

27. The circuit of claim 21, wherein said graded layer is graded in indium content at a gradient of less than 15% indium per micrometer.

28. The circuit of claim 21, wherein said graded layer and said uniform composition layer are grown via organometallic vapor phase epitaxy.

29. The circuit of claim 21 further comprising an epitaxially grown compositionally graded layer of $Ge_zSi_{1-z}$ between said GaAs epitaxial film and said Si substrate.

30. The circuit of claim 21 further comprising an epitaxially grown compositionally graded layer with at least one planarization step during processing between said GaAs epitaxial film and said Si substrate.

31. The circuit of claim 21 further comprising providing an insulator between said GaAs epitaxial film and said Si substrate.

32. The circuit of claim 21 further comprising a diffusion barrier between said GaAs epitaxial film and said Si substrate.

33. The circuit of claim 22 further comprising a III–V compound laser structure epitaxially grown on said planarized $In_yGa_{1-y}As$ epitaxial film.

34. The circuit of claim 22, wherein a III–V compound laser structure is wafer bonded to said planarized $In_yGa_{1-y}As$ epitaxial film.

35. The circuit of claim 22 further comprising a III–V compound field effect transistor structure epitaxially grown on said planarized $In_yGa_{1-y}As$ epitaxial film.

36. The circuit of claim 22, wherein a III–V compound field effect transistor structure is wafer bonded to said planarized $In_yGa_{1-y}As$ epitaxial film.

* * * * *